(12) United States Patent
Pawar et al.

(10) Patent No.: US 10,064,242 B2
(45) Date of Patent: Aug. 28, 2018

(54) MODIFIED ARCHITECTURE FOR CLOUD RADIO ACCESS NETWORKS AND APPROACH FOR COMPRESSION OF FRONT-HAUL DATA

(71) Applicant: INTEL IP CORPORATION, Santa Clara, CA (US)

(72) Inventors: Sameer Pawar, Santa Clara, CA (US); Huaning Niu, San Jose, CA (US); Apostolos Papathanassiou, San Jose, CA (US)

(73) Assignee: INTEL IP CORPORATION, Santa Clara, CA (US)

( * ) Notice: Subject to any disclaimer, the term of this patent is extended or adjusted under 35 U.S.C. 154(b) by 0 days.

(21) Appl. No.: 15/501,407

(22) PCT Filed: Jun. 30, 2015

(86) PCT No.: PCT/US2015/038679
§ 371 (c)(1),
(2) Date: Feb. 2, 2017

(87) PCT Pub. No.: WO2016/039839
PCT Pub. Date: Mar. 17, 2016

(65) Prior Publication Data
US 2017/0238361 A1 Aug. 17, 2017

Related U.S. Application Data

(60) Provisional application No. 62/048,730, filed on Sep. 10, 2014.

(51) Int. Cl.
*H04W 88/08* (2009.01)
*H03M 7/40* (2006.01)
*H04W 92/12* (2009.01)

(52) U.S. Cl.
CPC ........... *H04W 88/085* (2013.01); *H03M 7/40* (2013.01); *H04W 92/12* (2013.01)

(58) Field of Classification Search
CPC ....... H03M 7/30; H04W 88/08; H04W 28/08; H04W 28/085; H04W 88/085
See application file for complete search history.

(56) References Cited

U.S. PATENT DOCUMENTS

2012/0176966 A1 7/2012 Ling
2013/0010904 A1 1/2013 Tong et al.
(Continued)

FOREIGN PATENT DOCUMENTS

JP 2013026739 A 2/2013
WO 2014/025945 A3 2/2014
(Continued)

OTHER PUBLICATIONS

China Mobile Research Institute; C-RAN: The Road Towards Green RAN, White Paper; Version 2.5 (Oct. 2011).
(Continued)

*Primary Examiner* — Blane Jackson
(74) *Attorney, Agent, or Firm* — Thorpe North & Western (57) ABSTRACT

Systems and methods disclosed herein describe a centralized-processing cloud-based RAN (C-RAN or cloud-RAN) architecture that offers reduced front-haul data-rate requirements compared to common-public-radio-interface (CPRI) based C-RAN architectures. Base-band physical-layer processing can be divided between a BBU Pool and an enhanced RRH (eRRH). A frequency-domain compression approach that exploits LTE signal redundancy and user scheduling information can be used at the eRRH to significantly reduce front-haul data-rate requirements. Uniform scalar quantization and variable-rate Huffman coding in the frequency-domain can be applied in a compression approach (Continued)

based on the user scheduling information wherein a lossy compression is followed by a lossless compression.

25 Claims, 6 Drawing Sheets

(56) References Cited

U.S. PATENT DOCUMENTS

| | | |
|---|---|---|
| 2013/0083768 A1 | 4/2013 | Liu et al. |
| 2014/0226736 A1 | 8/2014 | Niu et al. |
| 2014/0269322 A1* | 9/2014 | Li .................. H04W 28/08 |
| | | 370/236 |

FOREIGN PATENT DOCUMENTS

| | | | |
|---|---|---|---|
| WO | 2014/076004 A2 | 5/2014 | |
| WO | 2014/076004 A3 | 5/2014 | |
| WO | WO 2014076004 * | 5/2014 | ............ H04W 88/08 |
| WO | 2014/124160 A3 | 8/2014 | |

OTHER PUBLICATIONS

CPRI Specification V5.0; Common Public Radio Interface (CPRI); Interface Specification (Sep. 21, 2011).

* cited by examiner

MODIFIED ARCHITECTURE FOR CLOUD RADIO ACCESS NETWORKS AND APPROACH FOR COMPRESSION OF FRONT-HAUL DATA

BACKGROUND

The demand for wireless communications has increased as mobile devices (e.g., cellular phones and tablets) have become more popular in recent years. In order to meet this demand, increasing numbers of base stations have been created in radio access networks (RANs). Since many of the devices that wirelessly connect to RANs are mobile, the load of network traffic at a given base station can vary throughout a typical day as consumers carry mobile devices to different locations.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Reference will now be made to the exemplary embodiments illustrated and specific language will be used herein to describe the same. It will nevertheless be understood that no limitation of the scope of is thereby intended.

DETAILED DESCRIPTION

Before some embodiments are disclosed and described, it is to be understood that the claimed subject matter is not limited to the particular structures, process operations, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating operations and do not necessarily indicate a particular order or sequence.

An initial overview of technology embodiments is provided below and then specific technology embodiments are described in further detail later. This initial summary is intended to aid readers in understanding the technology more quickly, but is not intended to identify key features or essential features of the technology nor is it intended to limit the scope of the claimed subject matter.

The demand for wireless communications has rapidly grown in recent years as mobile devices with wireless capabilities have become increasingly popular. Many of these mobile devices provide convenient functionality (e.g., internet access, voice calling, and texting) that relies on connections to wireless networks. As mobile devices have become more ubiquitous, the amount of traffic that moves through the wireless networks that serve these mobile devices has significantly increased.

This increase in the amount of traffic through wireless networks poses a challenge for the traditional radio access network (RAN) paradigm. The cost of building, upgrading, and maintaining traditional base station (BS) sites in order to meet the growing consumer demand for wireless traffic is high in terms of both the capital expenditure (CAPEX) and the operational expenditure (OPEX). This problem is further amplified by the fact that the peak-to-average ratio of a network load is often high. For example, a BS in a principally residential suburban area might experience high peak loads of wireless traffic for brief periods of time in the mornings before residents leave for work in a nearby city, but might experience very low loads for most of the day until residents return in the evening. In this type of scenario, the network resources of the BS are underutilized for much of the day.

In order to address these problems that arise in traditional RAN infrastructures, a centralized-processing cloud-based RAN (Cloud (C)-RAN) infrastructure has been proposed. In C-RAN, unlike traditional cellular systems, a central pool of base-band processing units (BBUs) performs most base-band processing, while remote radio heads (RRHs) perform transmission and reception of radio signals. The C-RAN architecture can improve energy efficiency by consolidating energy-consuming hardware equipment at a BBU pool. The C-RAN architecture can also reduce both the CAPEX and OPEX of a network by making centralized network management and network upgrades easier to accomplish. In addition, the C-RAN architecture can be used implement advanced coordinated multi-point (CoMP) communication and interference-management schemes such as Enhanced Inter-cell Interference Coordination (eICIC).

Figure 1:
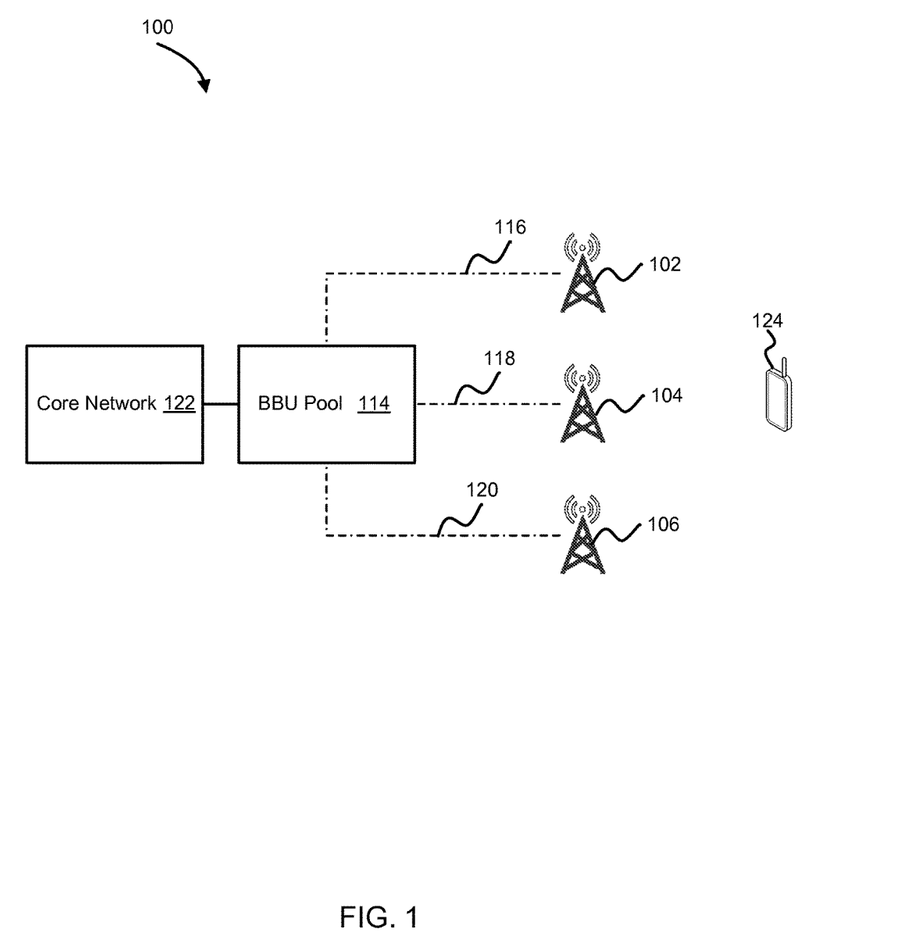
FIG. 1 illustrates a C-RAN architecture in accordance with an example.

FIG. 1 illustrates a typical C-RAN architecture 100. RRHs 102, 104, and 106 can send and receive wireless signals from devices with wireless capabilities, such as user equipments (UEs). The RRHs 102, 104, and 106 can be in communication with a BBU pool 114 via front-haul links 116, 118, and 120, respectively. A common public radio interface (CPRI) may be the type of interface used for connecting the RRHs 102, 104, and 106 to the BBU pool 114 via the front-haul links 116, 118, and 120. The BBU pool 114 can be in communication with a core network 122. In one example, a communication from the core network 122 to a wireless device 124 that is in a coverage area device of the RRH 102 (or the RRH 104 or the RRH 106) can be sent from the core network 122 to the BBU Pool 114. The BBU Pool 114 can then send the communication to the RRH 102 (or the RRH 104 or the RRH 106) via the front-haul link 116 (or the front-haul link 118 or the front-haul link 120, respectively). The communication can then be sent via a radio signal from the RRH 102 (or the RRH 104 or the RRH 106) to the wireless device 124. This is typically referred to as a downlink communication.

In another example, a communication from the wireless device 124 to the core network, referred to as an uplink communication, can be transmitted from the wireless device 124 and received at the RRH 102 (or the RRH 104 or the RRH 106) via a radio signal. The RRH 102 (or the RRH 104 or the RRH 106) can send the communication to the BBU Pool 114 via the front-haul link 116 (or the front-haul link 118 or the front-haul link 120, respectively). The BBU Pool 114 can then send the communication to the core network 122 where the communication can be directed to its intended destination.

Figure 2:
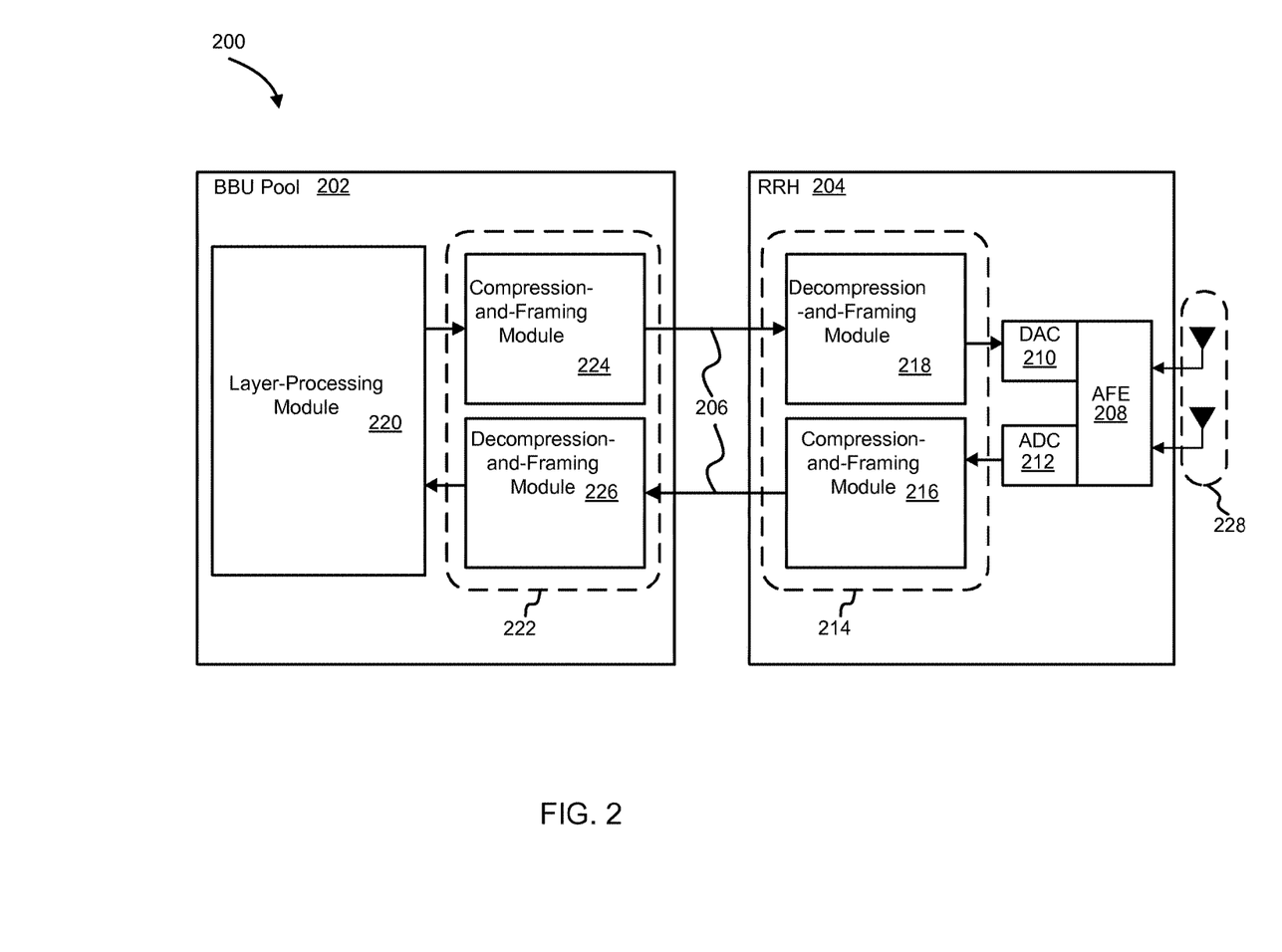
FIG. 2 illustrates a common-public-radio-interface (CPRI)-based C-RAN architecture in accordance with an example.

FIG. 2 illustrates an example of a CPRI-based C-RAN architecture 200 in which a BBU Pool 202 is connected to an RRH 204 by a front-haul link 206. The RRH 204 can comprise an Analog Front End (AFE) 208, a Digital-to-Analog Converter (DAC) 210, and an Analog-to-Digital Converter (ADC) 212. The AFE 208 may be operably connected to a plurality of antennas 228. In addition, as shown in selection 214, the RRH 204 can comprise at least two modules for CPRI processing: a compression-and-framing module 216 and a decompression-and-framing module 218. The BBU Pool 202 can comprise a layer-processing module 220 that handles processing for a Packet-Data-Convergence-Protocol (PDCP) layer, a Radio-Link-Control (RLC) layer, a Media Access Control (MAC) layer, and a Physical (PHY) layer. As shown in selection 222, the BBU Pool 202 can also comprise at least two modules for CPRI processing: a compression-and-framing module 224 and a decompression-and-framing module 226.

In one example, in a downlink communication, a signal can be sent from the layer-processing module 220 of the BBU pool 202 to the compression-and-framing module 224 of the BBU pool 202. The compression-and-framing module 224 can perform time-domain compression and framing operations on the signal and send the signal to the decompression-and-framing module 218 of the RRH 204 via the front-haul link 206 using CPRI protocol. The decompression-and-framing module 218 can perform decompression and framing operations on the signal and send the signal to the DAC 210. The DAC can convert the signal to an analog signal and send the analog signal to the AFE 208. The AFE can communicate the analog signal to the plurality of antennas 228. The plurality of antennas 228 can wirelessly send the analog signal to a destination device (e.g., a UE).

In another example, in an uplink communication, the plurality of antennas 228 can receive a radio signal and communicate the signal to the AFE 208. The AFE 208 can communicate the signal to the ADC 212. The ADC 212 can digitize the signal using phase (I) and quadrature (Q) sampling and send the digitized signal to the compression-and-framing module 216. The compression-and-framing module 216 can perform time-domain compression and framing operations on the signal and transfer the signal to the decompression-and-framing module 226 of the BBU pool 202 via the front-haul link 206 using CPRI protocol. The decompression-and-framing module 226 can perform decompression and framing operations on the signal and send the signal to the layer-processing module 220. The layer-processing module 220 can perform higher-layer base-band processing on the signal.

While the C-RAN paradigm alleviates many of the problems associated with the traditional RAN paradigm, the existing C-RAN architecture also introduces some new challenges. In particular, since existing C-RAN paradigms call for a CPRI interface to be used for connecting an RRH to a BBU pool, transfer-rate requirements for front-haul links used in a C-RAN architecture can be problematic because the expected transfer rate over the front-haul interface (i.e., the front-haul rate) can be significantly higher than the rate of data transfer over the radio interface.

For example, consider a long-term evolution (LTE) uplink (UL) system with a 10-megahertz (MHz) bandwidth, two receiving antennas at an RRH, and a sampling frequency of 15.36 MHz. If a 15-bit representation of I/Q phase digital samples is used, the I/Q data rate is 921.6 megabits per second (Mbps). If the CPRI basic frame overhead of one header byte for every 15 bytes of data and the line coding rate of 10/8 are considered, the physical line rate becomes 1.2288 gigabits per second (Gbps). In addition, the overall CPRI physical line rate increases linearly with the number of antennas and system bandwidth can quickly exceed 10 Gbps when carrier aggregation is used. These factors can therefore lead to front-haul rate requirements that are prohibitively high for practical deployments.

Other problems also affect existing C-RAN architectures. For instance, the sampling rate of CPRI is the same as the sampling rate of LTE and is independent of the user load or user activity within a cell; as a result, there is no statistical averaging gain. In addition, most of the CPRI data-rate requirement is driven by I/Q user-plane data samples. An LTE signal is inherently redundant due to the use of guard bands. In a 10 MHz LTE system, for example, only 600 of 1024 available sub-carriers are used for data; the other sub-carriers are zeroed out to serve as guard bands. However, although the time-domain I/Q samples have a redundant signal structure, a complex non-linear scheme is required to exploit this redundancy in order to achieve a higher compression factor. In addition, front-haul compression schemes that operate on the time-domain I/Q samples cannot exploit signal-to-quantization-noise ratios (SQNRs) for different modulation and coding schemes or user-scheduling side information (e.g., user activity, sub-carrier occupancy) because this information is generally lost once a signal is split in the time domain. For at least these reasons, compression performance is relatively poor in the existing C-RAN architecture.

Systems and methods in accordance with the present disclosure present an alternative C-RAN architecture (i.e., the PHY-split C-RAN architecture) in which base-band physical-layer processing is divided between a BBU Pool and an enhanced RRH (eRRH). A frequency-domain compression approach that exploits LTE signal redundancy and user scheduling information can be used at the eRRH to significantly reduce front-haul data-rate requirements. In some examples consistent with the current disclosure, uniform scalar quantization is used in conjunction with variable-rate Huffman coding in the frequency-domain compression approach. In some examples, the frequency-domain compression approach comprises a lossy compression followed by a lossless compression. In some examples, the portions of the architecture that are used for compression are separable such that hardware used for implementation can have low complexity.

Figure 3:
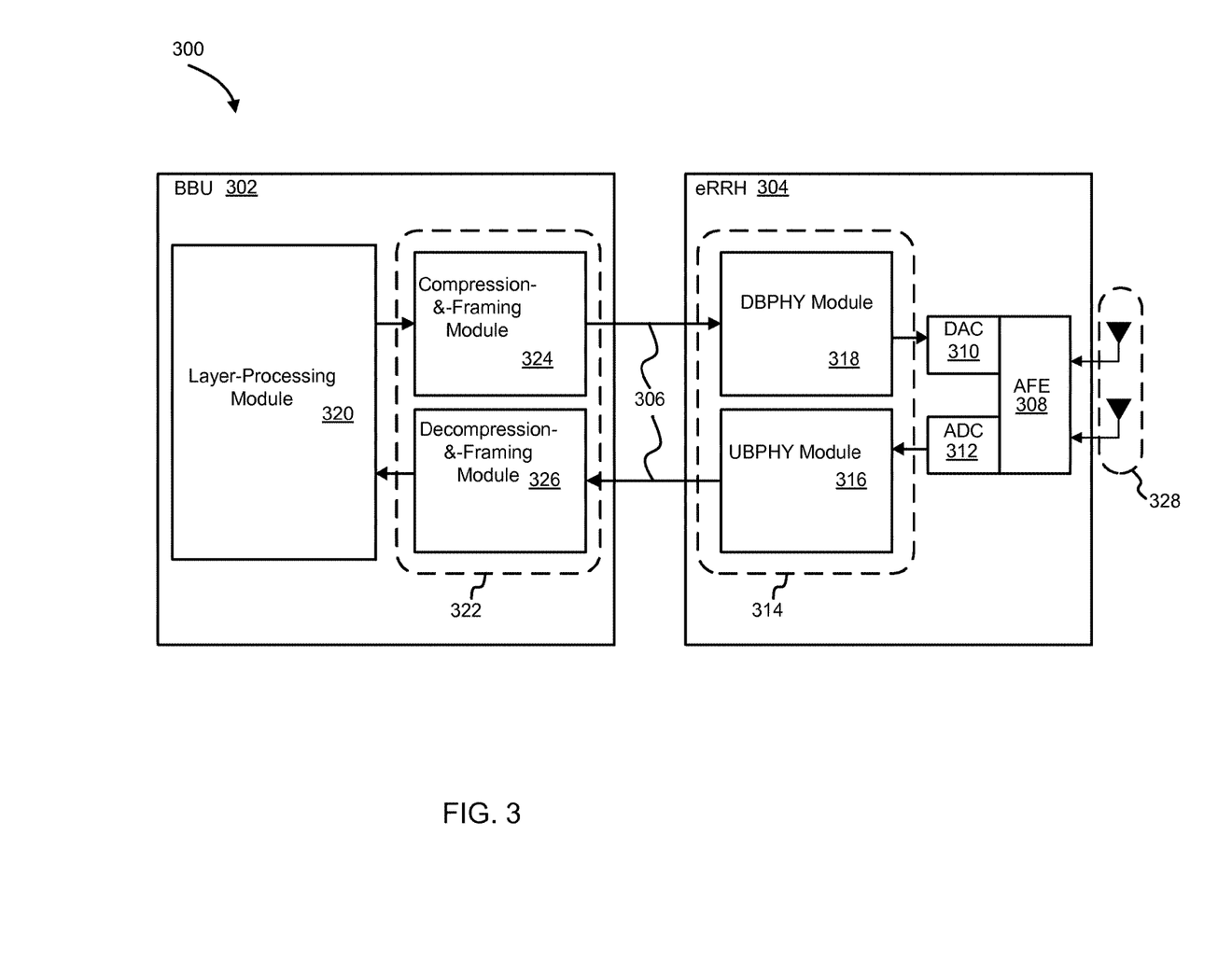
FIG. 3 illustrates a PHY-split C-RAN architecture in accordance with an example.

FIG. 3 is an illustration of a PHY-split C-RAN architecture 300 in accordance with an example. A BBU Pool 302 is connected to an enhanced RRH (eRRH) 304 by a front-haul link 306. The eRRH 304 can comprise an Analog Front End (AFE) 308, a Digital-to-Analog Converter (DAC) 310, and an Analog-to-Digital Converter (ADC) 312. The AFE 308 may be operably connected to a plurality of antennas 328. In addition, as shown in selection 314, the eRRH 304 can comprise two modules that perform some limited base-band physical-layer processing: an uplink base-band physical-layer-processing (UBPHY) module 316 and a downlink base-band physical-layer-processing (DBPHY) module 318. The BBU Pool 302 can comprise a layer-processing module 320 that handles processing for a Packet-Data-Convergence-Protocol (PDCP) layer, a Radio-Link-Control (RLC) layer, a Media Access Control (MAC) layer, and a Physical (PHY) layer. As shown in selection 322, the BBU Pool 302 can also comprise at least two additional processing modules: a compression-and-framing module 324 and a decompression-and-framing module 326.

In one example, an uplink radio signal can be received via the plurality of antennas 328 and communicated to the AFE 308. The AFE 308 can communicate the signal to the ADC 312. The ADC 312 can digitize the signal using phase (I) and quadrature (Q) sampling and send the digitized signal to the UBPY module 316. The UBPHY module 316 can perform some physical (PHY)-layer processing functions on the uplink signal, such as cyclic-prefix (CP) removal and computation of fast Fourier transforms (FFTs). The UBPHY module 316 can also perform compression and framing operations on the signal and transfer the signal to the decompression-and-framing module 326 of the BBU pool 302 via the front-haul link 306. The decompression-and-framing module 326 can perform decompression and framing operations on the signal and send the signal to the layer-processing module 320. The layer-processing module 320 can perform higher-layer base-band processing functions on the signal that have not already been performed by the UBPHY module 316, such as channel estimation, turbo coding/decoding, and multiple-antenna processing.

In one example, a downlink signal can be received from the core network by the layer-processing module 320 of the BBU pool 302 from a core network. The layer-processing module 320 can send the signal to the compression-and-framing module 324 of the BBU pool 202. The compression-and-framing module 224 can perform compression and framing operations on the signal and send the signal to the DBPHY module 318 of the RRH 304 via the front-haul link 306. The DBPHY module 318 can perform some PHY-layer processing functions on the downlink signal that were not previously performed by the layer-processing module 320, such as cyclic-prefix (CP) addition and computation of inverse fast Fourier transforms (IFFTs). The DBPHY module 318 can also perform decompression and framing operations on the signal and send the signal to the DAC 310. The DAC can convert the signal to an analog signal and send the analog signal to the AFE 308. The AFE can communicate the analog signal to the plurality of antennas 328. The plurality of antennas 328 can wirelessly send the analog signal to a destination device (e.g., a UE).

In some examples consistent with the current disclosure (e.g., examples using LTE), time-frequency resource allocation among multiple users and user-scheduling side information for both downlink (DL) and uplink (UL) is available at the BBU pool. Some examples of user-scheduling side information include, but are not limited to, occupied sub-carriers, constellation or modulation on individual sub-carriers, turbo coding rates, numbers of users scheduled in multiple-input multiple-output (MIMO), hybrid-automatic-repeat-request (HARQ) statuses, target signal-to-interference-noise ratios (SINRs), and average bit/block error performances.

In examples consistent with the current disclosure, user-scheduling side information can be used to achieve desirable compression of I/Q data samples that flow through a front-haul link. For reliable decoding of base-band information, the target SQNR generally varies based on the modulation and coding scheme used. As a result, the number of bits assigned to quantize resource blocks carrying quadrature-phase-shift-keying (QPSK) symbols can be significantly less than the number of bits assigned to quantize resource blocks carrying 64-quadrature-amplitude-modulation (64-QAM) symbols.

Figure 4:
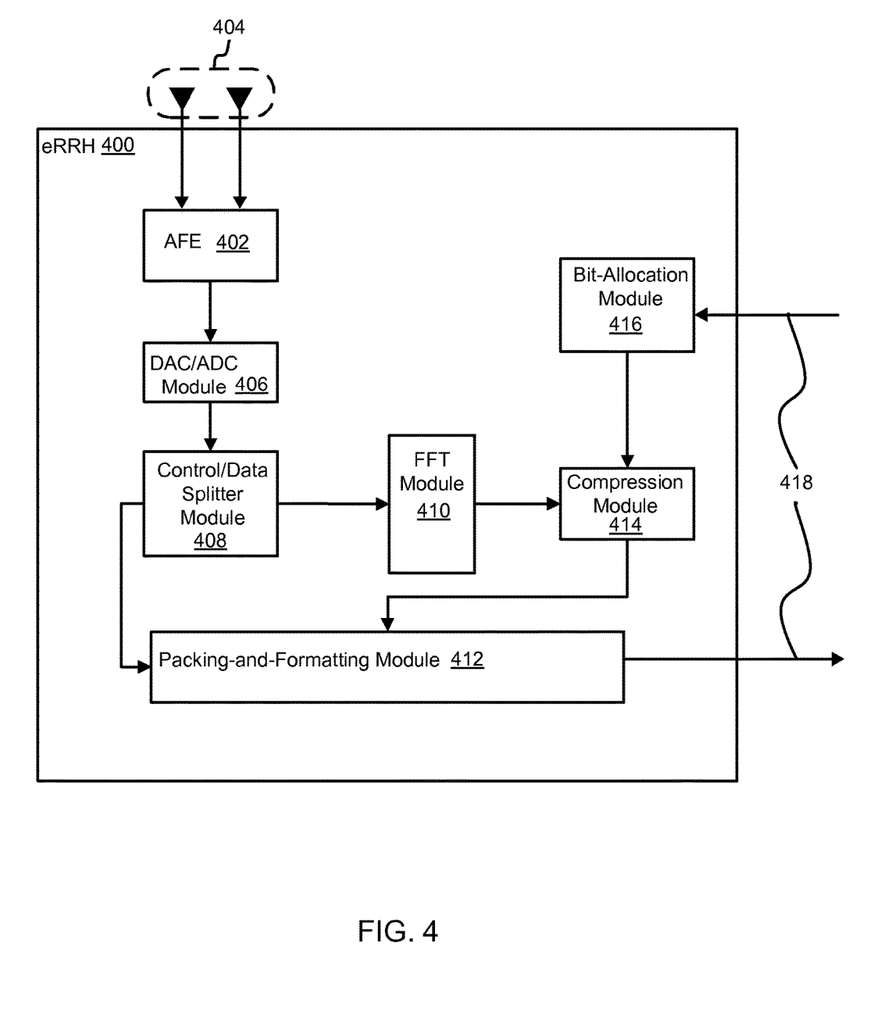
FIG. 4 illustrates a diagram of an enhanced remote radio head (eRRH) in accordance with an example.

FIG. 4 illustrates a diagram of an enhanced remote radio head (eRRH) 400 in accordance with an example. The eRRH 400 can comprise an Analog Front End (AFE) 402 that is operably connected to a plurality of antennas 404. The AFE 402 can receive a radio signal from via the plurality of antennas 404. The AFE 402 can communicate a received uplink signal to the DAC/ADC module 406. The DAC/ADC module 406 can comprise an analog-to-digital converter (ADC) and/or a digital-to-analog converter (DAC). The DAC/ADC module 406 can digitize the signal using phase (I) and quadrature (Q) sampling and send the digitized signal to the control/data-splitter module 408. In some embodiments, the digitized signal can comprise time-domain I/Q samples.

The control/data-splitter module 408 can perform cyclic prefix (CP) removal on the digitized signal and separate user-plane data symbols (i.e., physical-uplink-shared-channel (PUSCH) I/Q symbols) in the digitized signal from non-data symbols, such as reference signals, physical-uplink-control-channel (PUCCH) symbols, and a random-access-channel (RACH) signal in the digitized signal. In some embodiments, the user-plane data symbols may be represented by a plurality of time-domain I/Q samples. The control/data-splitter module 408 can then send the user-plane data symbols (i.e., PUSCH I/Q symbols) to a fast-Fourier-transform (FFT) module 410 and send the reference signals, physical-uplink-control-channel (PUCCH) symbols, and the random-access-channel (RACH) signal to the packing-and-formatting module 412. The FFT module 410 can perform an FFT on the user-plane data symbols (i.e., PUSCH I/Q symbols) by computing the FFT and send the user-plane data symbols (i.e., PUSCH I/Q symbols) to the compression module 414. In some embodiments, the FFT module 410 can, more specifically, performs an FFT on a plurality of time-domain I/Q samples that represent the user-plane data symbols in order to generate a plurality of frequency-domain I/Q samples that represent the user-plane data symbols.

The bit-allocation module 416 can receive side information from a BBU Pool for an orthogonal frequency division multiple access (OFDMA) uplink signal via the front-haul link 418. The side information can comprise modulation and coding schemes used per physical resource block (PRB), number of multiple-input multiple-output (MIMO) connections, CoMP scheme, number of users scheduled on a particular PRB, and/or HARQ status. In one embodiment, the bit-allocation module 416 can assign a number of quantization bits to be used by the compression module 414 to quantize each symbol in a given PRB based on the side information that corresponds to the given PRB. A bit budget applied by the bit-allocation module 416 can be a function of the side information and can be constant for all symbols within the given PRB. Various bit budget schemes can be used. In one example, the bit budget can be based on modulation order, as shown in the table below:

| Modulation Order | Bits allocated per real symbol |
|---|---|
| QPSK | 4 |
| 16-QAM | 5 |
| 64-QAM | 6 |

The bit-allocation module 416 can communicate the number of bits to be used to quantize each symbol in the given PRB to the compression module 414. The compression module 414 can normalize PUSCH I/Q samples (e.g., frequency-domain PUSCH I/Q samples) corresponding to the PUSCH I/Q symbols received from the FFT module on a per PRB basis by subtracting a mean value and using a scaling value such that the normalized I/Q samples have values ranging from −1 to 1. The compression module 414 can comprise a uniform scalar quantizer that is used to perform a lossy compression in which the normalized I/Q samples are uniformly quantized to finite bits. The number of bits used for each normalized I/Q sample can be in accordance with the bit budget provided by the bit-allocation module 416 for the PRB to which each respective normalized I/Q sample pertains. The lossy compression can produce uniformly quantized normalized I/Q samples that represent the information found in the PUSCH I/Q symbols.

The use of scheduling side information to determine a bit allocation level per PRB can significantly reduce the amount of data that is sent over a front-haul link 418 by enabling a higher compression rate of the data. For instance, in one example, testing and simulation has shown that a ten times (10×) compression ratio is possible by using the scheduling side information, along with other compression techniques described herein. Higher levels of compression enables the C-RAN architecture to be more easily implemented by reducing the bottleneck that occurs at the front-haul link.

The compression module 414 can also perform a lossless compression by using a lossless, prefix-free Huffman code to compress the two most significant bits (MSBs) of each uniformly quantized normalized I/Q sample. In one example, the Huffman code can be defined by the following table:

| MSBs | Code Bits |
|------|-----------|
| 00   | 0         |
| 01   | 10        |
| 10   | 110       |
| 11   | 111       |

In the distribution of MSBs found in quantized normalized I/Q samples (e.g., in samples taken from an LTE signal using guard bands), values of 00 can be more common for the first two MSBs than values of 01, 10, and 11. As a result, the lossless compression performed by the compression module 414 can reduce the number of bits required to represent the uniformly quantized normalized I/Q samples. The lossless compression can produce quantized magnitude bits that represent the information found in the uniformly quantized normalized I/Q samples. The compression module 414 can then send the quantized magnitude bits and sign bit corresponding to each quantized normalized I/Q sample along with the scaling value and mean value for each PRB to the packing-and-formatting module 412.

The packing-and-formatting module 412 can pack and format the reference signals, physical-uplink-control-channel (PUCCH) symbols, and the random-access-channel (RACH) signal received from the control/data-splitter module 408. In addition, the packing-and-formatting module 412 can pack and format the quantized magnitude bits, sign bits, scaling values, and mean values received from the compression module 414. The packing-and-formatting module 412 can send one or more communications comprising the packed and formatted quantized magnitude bits, sign bits, scaling values, and mean values to the BBU Pool via the front-haul link 418.

While FIG. 4 provides one exemplary diagram of an eRRH, other eRRH models, designs, and configurations are possible. In some embodiments, for example, several modules that are shown as separate in FIG. 4 may also be represented as a single module, depending on the level of abstraction that is applied. For example, at one layer of abstraction, the DAC/ADC module 406, the control/data-splitter module 408, and the FFT module 410 can be represented as a single module (e.g., a pre-processing module) that performs the functions described for the three separate modules.

In addition, individual modules depicted in FIG. 4 may also be represented as separate modules, depending on the level of abstraction is applied. The compression module 414, for example, may also be represented as a first (lossy) compression module and a second (lossless) compression module, since separate hardware and/or software may be used for the lossy compression and the lossless compression, respectively.

Additional modules other than those explicitly illustrated in FIG. 4 may be included in some eRRH models. For example, an optional intermediate processing module that can compress and/or decode reference signals, physical-uplink-control-channel (PUCCH) symbols, and/or the random-access-channel (RACH) signal sent from the control/splitter module 408 may be inserted on the path between the control/data-splitter module 408 and the packing-and-formatting module 412.

In some eRRH models consistent with the present disclosure, the order in which some operations are performed can vary. For example, in some eRRH models, an FFT of a received signal can be computed before the user-plane data symbols and the reference signals are split.

Figure 5:
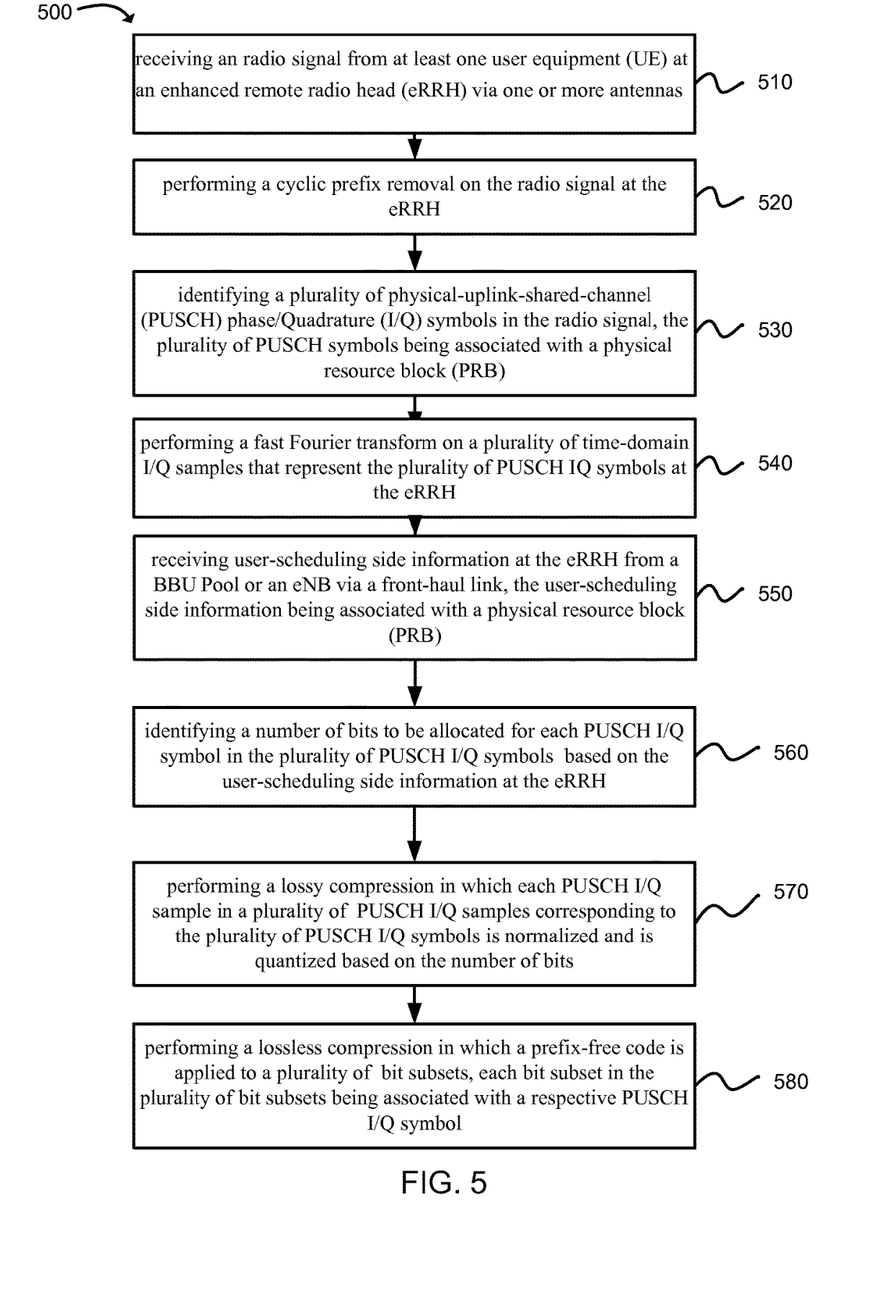
FIG. 5 is a flow chart that illustrates exemplary functionality of an eRRH in accordance with an example.

FIG. 5 is a flow diagram illustrating exemplary functionality 500 of an eRRH that is capable of lowering a front-haul data-rate requirement in a PHY-split C-RAN. The functionality can be implemented as a method or the functionality can be executed as instructions on a machine, where the instructions are included on at least one computer readable medium or one non-transitory machine readable storage medium. As in 510, a radio signal can be received from at least one UE at an eRRH. In some examples, the radio signal may be digitized by an ADC. As in 520, cyclic prefix removal can be performed on the radio signal at the eRRH; in some examples, the cyclic prefix removal can be performed by a control/data splitter module at the eRRH. As in 530, a plurality of PUSCH I/Q symbols that are associated with a PRB in the radio signal can be identified at the eRRH. In some examples, the PUSCH I/Q symbols can be identified by the control/data splitter module (e.g., by identifying a plurality of time-domain I/Q samples corresponding to the PUSCH I/Q symbols). As in 540, a FFT can be performed on a plurality of time-domain I/Q samples that represent the plurality of PUSCH I/Q symbols at the eRRH. In some examples, the FFT can be performed by an FFT module at the eRRH.

As in 550, user-scheduling side information that is associated with the PRB can be received at the eRRH from a BBU Pool or an evolved Node B (eNB) via a front-haul link. In some examples, the user-scheduling side information can be received by a bit-allocation module at the eRRH. The user-scheduling side information can comprise one or more of: a user activity, a sub-carrier occupancy, a constellation or modulation on individual sub-carriers, a turbo coding rate, a number of users scheduled in multiple-input multiple-output (MIMO), a hybrid-automatic-repeat-request (HARQ) status, a target signal-to-interference-noise ratios (SINR), or an average bit/block error performance.

As in 560, a number of bits to be allocated for each PUSCH I/Q symbol in the plurality of PUSCH I/Q symbols can be identified based on the user-scheduling side information (e.g., based on a modulation order that the user-scheduling side information comprises). In some examples, the number of bits can be determined and/or identified by the bit-allocation module at the eRRH. The bit-allocation module can determine that the number of bits to be used for each PUSCH I/Q symbol is four bits per symbol when the modulation order is quadrature-phase-shift-keying (QPSK), five bits per symbol when the modulation order is 16-quadrature-amplitude-modulation (16-QAM), and six bits per symbol when the modulation order is 64-quadrature-amplitude-modulation (64-QAM).

As in 570, a lossy compression can be performed at the UE. In some examples, the lossy compression can be performed by a compression module at the eRRH. As part of the lossy compression (or as a preliminary pre-processing action), each PUSCH I/Q sample in a plurality of PUSCH I/Q samples (e.g., frequency-domain I/Q samples produced by performing an FFT on time-domain I/Q samples corresponding to the PUSCH I/Q symbols) corresponding to the plurality of PUSCH I/Q symbols can be normalized. In some examples, each PUSCH I/Q can be normalized to a value ranging from −1 to 1 by subtracting a mean value and using a scaling value. The normalized PUSCH I/Q samples can then be quantized based on the number of bits. In some examples, uniform scalar quantization can be applied to each normalized PUSCH I/Q sample (e.g., by a uniform scalar quantizer).

As in 580, a lossless compression can be performed at the UE. In some examples, the lossless compression can be performed by the compression module at the eRRH. In the lossless compression, a prefix-free code can be applied to a plurality of bit subsets, each bit subset in the plurality of bit subsets being associated with a respective PUSCH I/Q sample in the plurality of PUSCH I/Q samples. In some examples, each bit subset in the plurality of bit subsets can comprise the two most significant bits (MSBs) of the PUSCH I/Q sample with which the bit subset is associated. In some examples, the prefix-free code can be a Huffman code in which a value of 00 for the MSBs maps to a single coded bit having a value of 0; a value of 01 for the MSBs maps to two coded bits having a value of 10; a value of 10 for the MSBs maps to three coded bits having a value of 110; and a value of 11 for the MSBs maps to four coded bits having a value of 111.

In some examples, the eRRH can also comprise a reference-signal compression module configured to apply an additional compression technique (e.g., a compression technique that is different from the compression techniques applied to the bit subsets, the I/Q samples, and/or the PUSCH symbols) to at least one of the reference signals, the physical-uplink-control-channel (PUCCH) symbols, or the random-access-channel (RACH) signal.

Figure 6:
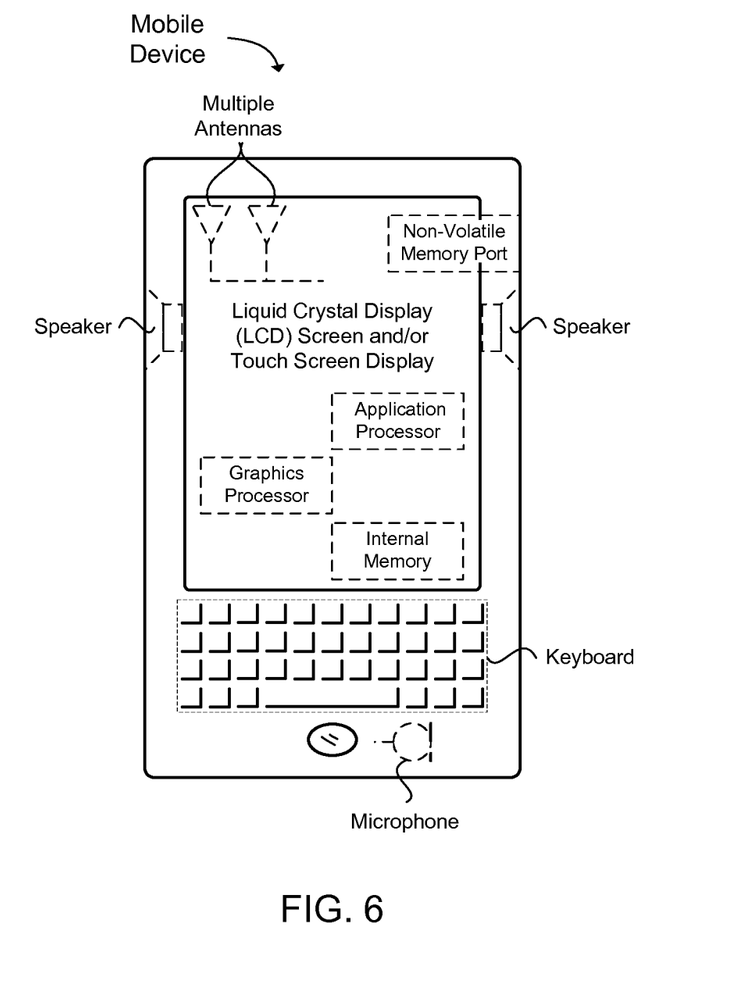
FIG. 6 provides an example illustration of a wireless device in accordance with an example.

FIG. 6 provides an example illustration of the wireless device, such as a user equipment (UE), a mobile station (MS), a mobile wireless device, a mobile communication device, a tablet, a handset, or other type of wireless device. The wireless device can include one or more antennas configured to communicate with a node, macro node, low power node (LPN), or, transmission station, such as a base station (BS), an evolved Node B (eNB), a baseband processing unit (BBU), a remote radio head (RRH), a remote radio equipment (RRE), a relay station (RS), a radio equipment (RE), or other type of wireless wide area network (WWAN) access point. The wireless device can be configured to communicate using at least one wireless communication standard including 3GPP LTE, WiMAX, High Speed Packet Access (HSPA), Bluetooth, and WiFi. The wireless device can communicate using separate antennas for each wireless communication standard or shared antennas for multiple wireless communication standards. The wireless device can communicate in a wireless local area network (WLAN), a wireless personal area network (WPAN), and/or a WWAN.

FIG. 6 also provides an illustration of a microphone and one or more speakers that can be used for audio input and output from the wireless device. The display screen can be a liquid crystal display (LCD) screen, or other type of display screen such as an organic light emitting diode (OLED) display. The display screen can be configured as a touch screen. The touch screen can use capacitive, resistive, or another type of touch screen technology. An application processor and a graphics processor can be coupled to internal memory to provide processing and display capabilities. A non-volatile memory port can also be used to provide data input/output options to a user. The non-volatile memory port can also be used to expand the memory capabilities of the wireless device. A keyboard can be integrated with the wireless device or wirelessly connected to the wireless device to provide additional user input. A virtual keyboard can also be provided using the touch screen.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data. The node and wireless device can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

As used herein, the term processor can include general-purpose processors, specialized processors such as VLSI, FPGAs, and other types of specialized processors, as well as base-band processors used in transceivers to send, receive, and process wireless communications.

It should be understood that many of the functional units described in this specification have been labeled as modules, in order to more particularly emphasize their implementation independence. For example, a module can be implemented as a hardware circuit (e.g., an application-specific integrated circuit (ASIC)) comprising custom VLSI circuits or gate arrays, off-the-shelf semiconductors such as logic chips, transistors, or other discrete components. A module can also be implemented in programmable hardware devices such as field programmable gate arrays, programmable array logic, programmable logic devices or the like.

Modules can also be implemented in software for execution by various types of processors. An identified module of executable code can, for instance, comprise one or more physical or logical blocks of computer instructions, which can, for instance, be organized as an object, procedure, or function. Nevertheless, the executables of an identified module need not be physically located together, but can comprise disparate instructions stored in different locations which, when joined logically together, comprise the module and achieve the stated purpose for the module.

Indeed, a module of executable code can be a single instruction, or many instructions, and can even be distributed over several different code segments, among different programs, and across several memory devices. Similarly, operational data can be identified and illustrated herein within modules, and can be embodied in any suitable form and organized within any suitable type of data structure. The operational data can be collected as a single data set, or can be distributed over different locations including over different storage devices, and can exist, at least partially, merely as electronic signals on a system or network. The modules can be passive or active, including agents operable to perform desired functions.

As used herein, the term "processor" can include general purpose processors, specialized processors such as VLSI, FPGAs, and other types of specialized processors, as well as base band processors used in transceivers to send, receive, and process wireless communications.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and examples can be referred to herein along with alternatives for the various components thereof. It is understood that such embodiments, examples, and alternatives are not to be construed as de facto equivalents of one another, but are to be considered as separate and autonomous embodiments, examples, and alternatives.

Furthermore, the described features, structures, or characteristics can be combined in any suitable manner in one or more embodiments. In the following description, numerous specific details are provided, such as examples of layouts, distances, network examples, etc., to provide a thorough understanding of some embodiments. One skilled in the relevant art will recognize, however, that some embodiments may differ with respect to one or more of the specific details, or with other methods, components, layouts, etc. In other instances, well-known structures, materials, or operations are not shown or described in detail to avoid obscuring aspects of the embodiments.

While the forgoing examples are illustrative of the principles of some embodiments in one or more particular applications, it will be apparent to those of ordinary skill in the art that numerous modifications in form, usage and details of implementation can be made without the exercise of inventive faculty, and without departing from the principles and concepts set forth in the disclosure and the claims. Accordingly, it is not intended that the disclosure or the drawings be limiting; the intended limitations are set forth by the claims below.

What is claimed is:

1. An enhanced Remote Radio Head (eRRH) configured to be used in in a Cloud-based Radio-access Network (C-RAN) in which base-band physical-layer processing is split between a Base-band Processing Unit (BBU) Pool and the eRRH, the eRRH comprising:
   one or more processors;
   an analog front end (AFE) configured to receive a radio signal from at least one user equipment (UE) via one or more antennas;
   an analog-to-digital converter (ADC) configured to receive the radio signal from the AFE and digitize the radio signal; and
   a control/data-splitter module configured to:
   receive the digitized radio signal from the ADC,
   perform cyclic prefix removal on the digitized radio signal using the one or more processors, and
   identify a plurality of time-domain physical-uplink-shared-channel (PUSCH) phase/Quadrature (I/Q) samples in the digitized radio signal, the plurality of time-domain PUSCH I/Q samples corresponding to a plurality of PUSCH I/Q symbols, wherein the plurality of PUSCH I/Q symbols is associated with a physical resource block (PRB).

2. The eRRH of claim 1, further comprising:
   a fast-Fourier-transform (FFT) module configured to receive the plurality of time-domain PUSCH I/Q samples from the control/data-splitter module and perform a fast Fourier transform on the time-domain PUSCH I/Q samples to produce a plurality of frequency-domain PUSCH I/Q samples corresponding to the plurality of PUSCH I/Q symbols.

3. The eRRH of claim 2, further comprising a bit-allocation module configured to:
   receive user-scheduling side information from the BBU Pool via a front-haul link, the user-scheduling side information being associated with the (PRB); and
   identify a number of bits to be allocated for each PUSCH I/Q symbol in the plurality of PUSCH I/Q symbols based on the user-scheduling side information.

4. The eRRH of claim 3, further comprising a compression module configured to:
   receive the plurality of frequency-domain PUSCH I/Q samples from the FFT module;
   receive the number of bits to be used for each PUSCH I/Q symbol in the plurality of PUSCH I/Q symbols from the bit-allocation module; and
   perform a lossy compression in which each frequency-domain PUSCH I/Q sample in the plurality of frequency-domain PUSCH I/Q samples corresponding to the plurality of PUSCH I/Q symbols is normalized and is quantized based on the number of bits received from the bit-allocation module.

5. The eRRH of claim 4, wherein the compression module is further configured to normalize each frequency-domain PUSCH I/Q sample in the plurality of frequency-domain PUSCH I/Q samples to a value ranging from −1 to 1 by subtracting a mean value and using a scaling value.

6. The eRRH of claim 4, wherein the compression module is further configured to apply uniform quantization to quantize each frequency-domain PUSCH I/Q sample in the plurality of frequency-domain PUSCH I/Q samples.

7. The eRRH of claim 4, wherein the bit-allocation module is further configured to identify a number of bits to be used for each PUSCH I/Q symbol in the plurality of PUSCH I/Q symbols based on a modulation order contained in the user-scheduling side information.

8. The eRRH of claim 7, wherein the bit allocation module is further configured to determine that the number of bits to be allocated for each PUSCH I/Q symbol is four bits per symbol when the modulation order is quadrature-phase-shift-keying (QPSK), five bits per symbol when the modulation order is 16-quadrature-amplitude-modulation (16-QAM), and six bits per symbol when the modulation order is 64-quadrature-amplitude-modulation (64-QAM).

9. The eRRH of claim 4, wherein the compression module is further configured to perform a lossless compression in which a prefix-free code is applied to a plurality of bit subsets, each bit subset in the plurality of bit subsets being associated with a respective PUSCH I/Q sample in the plurality of PUSCH I/Q samples.

10. The eRRH of claim 9, wherein each bit subset in the plurality of bit subsets comprises the two most significant bits (MSBs) of the respective frequency-domain PUSCH I/Q sample in the plurality of frequency-domain PUSCH I/Q samples.

11. The eRRH of claim 10, using a Huffman code as the prefix-free code, wherein:
a value of 00 for the MSBs maps to a single coded bit having a value of 0;
a value of 01 for the MSBs maps to two coded bits having a value of 10;
a value of 10 for the MSBs maps to three coded bits having a value of 110; and
a value of 11 for the MSBs maps to four coded bits having a value of 111.

12. The eRRH of claim 3, wherein the user-scheduling side information comprises one or more of: a user activity, a sub-carrier occupancy, a constellation or modulation on individual sub-carriers, a turbo coding rate, a number of users scheduled in multiple-input multiple-output (MIMO), a hybrid-automatic-repeat-request (HARQ) status, a target signal-to-interference-noise ratios (SINR), or an average bit/block error performance.

13. The eRRH of claim 1, wherein the control/data-splitter module is further configured to identify reference signals, physical-uplink-control-channel (PUCCH) symbols, and a random-access-channel (RACH) signal in the radio signal and wherein the eRRH further comprises a reference-signal compression module configured to apply a compression technique different from a compression technique applied to the plurality of PUSCH symbols to at least one of the reference signals, the physical-uplink-control-channel (PUCCH) symbols, or the random-access-channel (RACH) signal.

14. A computer-readable medium having instructions thereon which, when executed by one or more processors, perform the following:
receiving a radio signal at an enhanced remote radio head (eRRH);
performing a cyclic prefix removal on the radio signal at the eRRH;
identifying a plurality of time-domain physical-uplink-shared-channel (PUSCH) phase/Quadrature (I/Q) samples in the radio signal, the plurality of time-domain PUSCH I/Q samples corresponding to a plurality of PUSCH I/Q symbols, wherein the plurality of PUSCH I/Q symbols is associated with a physical resource block (PRB) in the radio signal; and
performing a fast Fourier transform on the plurality of time-domain PUSCH I/Q samples at the eRRH to produce a plurality of frequency-domain PUSCH I/Q samples corresponding to the plurality of PUSCH I/Q symbols.

15. The computer-readable medium of claim 14, further having instructions thereon which, when executed by one or more processors, perform the following:
receiving user-scheduling side information at the eRRH from a BBU Pool or an evolved Node B (eNB) via a front-haul link, the user-scheduling side information being associated with the PRB; and
identifying a designated a number of bits to be used for each PUSCH I/Q symbol in the plurality of PUSCH I/Q symbols based on the user-scheduling side information at the eRRH.

16. The computer-readable medium of claim 15, wherein the user-scheduling side information comprises one or more of: a user activity, a sub-carrier occupancy, a constellation or modulation on individual sub-carriers, a turbo coding rate, a numbers of users scheduled in multiple-input multiple-output (MIMO), a hybrid-automatic-repeat-request (HARQ) status, a target signal-to-interference-noise ratios (SINK), or an average bit/block error performance.

17. The computer-readable medium of claim 15, further having instructions thereon which, when executed by one or more processors, perform the following:
identifying the designated number of bits to be used for each PUSCH I/Q symbol in the plurality of PUSCH I/Q symbols based on a modulation order contained in the user-scheduling side information.

18. The computer-readable medium of claim 15, further having instructions thereon which, when executed by one or more processors, perform the following:
normalizing each frequency-domain PUSCH I/Q sample in the plurality of frequency-domain PUSCH I/Q samples, the plurality of frequency-domain PUSCH I/Q samples corresponding to the plurality of PUSCH I/Q symbols, at the eRRH;
performing a lossy frequency-domain compression at the eRRH in which each frequency-domain PUSCH I/Q sample in the plurality of frequency-domain PUSCH I/Q samples is discretized based on the designated number of bits.

19. The computer-readable medium of claim 18, further having instructions thereon which, when executed by one or more processors, perform the following:
performing a lossless compression in which a prefix-free code is applied to a plurality of bit subsets, each bit subset in the plurality of bit subsets being associated with a respective frequency-domain PUSCH I/Q sample in the plurality of frequency-domain PUSCH I/Q samples.

20. The computer-readable medium of claim 19, wherein each bit subset in the plurality of bit subsets comprises the two most significant bits (MSBs) of the respective PUSCH I/Q sample with which the bit subset is associated.

21. The computer-readable medium of claim 20, wherein the prefix-free code is a Huffman code wherein:

a value of 00 for the MSBs maps to a single coded bit having a value of 0;

a value of 01 for the MSBs maps to two coded bits having a value of 10;

a value of 10 for the MSBs maps to three coded bits having a value of 110; and a value of 11 for the MSBs maps to four coded bits having a value of 111.

22. An enhanced Remote Radio Head (eRRH) configured to be used in in a Cloud-based Radio-access Network (C-RAN) comprising:

an analog front end (AFE) configured to receive one or more radio signals from one or more user equipments (UEs) via one or more antennas;

a control/data splitter configured to separate user plane data symbols from reference symbols and control information in the one or more radio signals;

a bit allocation unit configured to receive scheduling side information for the one or more UEs and determine a quantization level for each user plane data symbol based on the scheduling side information; and a compression unit configured to compress the user plane data symbols based on the quantization level to form compressed quantized samples to enable the compressed quantized samples to be communicated over a front-haul link to a base band unit.

23. The eRRH of claim 22, wherein the bit allocation unit is further configured to determine the quantization level based on scheduling side information comprising one or more of: a user activity, a sub-carrier occupancy, a constellation or modulation on individual sub-carriers, a turbo coding rate, a number of users scheduled in multiple-input multiple-output (MIMO), a hybrid-automatic-repeat-request (HARQ) status, a target signal-to-interference-noise ratios (SINR), or an average bit/block error performance.

24. The eRRH of claim 22, wherein the bit allocation unit is further configured to determine the quantization level for each data symbol in a physical resource block (PRB).

25. The eRRH of claim 22, wherein the compression unit is further configured to perform a lossless compression in which a prefix-free code is applied to the compressed quantized samples.

* * * * *